(12) United States Patent
Ravindra et al.

US007737515B2

(10) Patent No.: US 7,737,515 B2
(45) Date of Patent: Jun. 15, 2010

(54) METHOD OF ASSEMBLY USING ARRAY OF PROGRAMMABLE MAGNETS

(75) Inventors: Nuggehalli M. Ravindra, Summit, NJ (US); Vijay Kasisomayajula, Harrison, NJ (US); Sudhakar Shet, Lakewood, CO (US); Anthony T. Fiory, Summit, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 64 days.

(21) Appl. No.: 12/142,897

(22) Filed: Jun. 20, 2008

(65) Prior Publication Data

US 2008/0315336 A1 Dec. 25, 2008

Related U.S. Application Data

(60) Provisional application No. 60/936,421, filed on Jun. 20, 2007.

(51) Int. Cl.
*H01L 29/82* (2006.01)
*H01L 43/00* (2006.01)
(52) U.S. Cl. ............... 257/422; 257/421; 257/E29.167; 257/E29.323
(58) Field of Classification Search .................. 257/421, 257/422, E29.167, E29.323
See application file for complete search history.

(56) References Cited

U.S. PATENT DOCUMENTS

| | | | |
|---|---|---|---|
| 4,542,397 | A | 9/1985 | Biegelsen et al. |
| 5,034,802 | A | 7/1991 | Liebes, Jr. et al. |
| 5,962,975 | A | 10/1999 | Lepselter |
| 6,072,251 | A * | 6/2000 | Markle .................... 310/12.05 |
| 6,650,079 | B2 * | 11/2003 | Binnard ...................... 318/649 |
| 6,833,277 | B2 | 12/2004 | Fonstad, Jr. et al. |
| 6,888,178 | B2 | 5/2005 | Fonstad et al. |

(Continued)

FOREIGN PATENT DOCUMENTS

WO WO 2005/089184 A2 9/2005

(Continued)

OTHER PUBLICATIONS

Sudhakar, et al., The Magnetic Field-Assisted Assembly of Nanoscale Semiconductor Devices: A New Technique, JOM, Oct. 2004, pp. 32-34.

*Primary Examiner*—Ngan Ngo
(74) *Attorney, Agent, or Firm*—McCarter & English, LLP

(57) ABSTRACT

Systems and methods for assembling a structure onto a substrate include an array of programmable magnets disposed beneath a substrate, wherein a magnetic field is applied to the structure to levitate the structure above the substrate while the structure is moved relative to the substrate to align the structure with a corresponding recess formed in the substrate. A magnetic field may be applied to translate and rotate the structure relative to the substrate. Differences between or among the programmable magnets regarding magnetic polarity, energized versus de-energized status, and magnetic field strength may be used to move the structure relative to the substrate in conjunction with a closed-loop control system. A bonded substrate assembly and a method of bonding a first wafer to a second wafer include wherein the first wafer includes a projection and the second wafer includes a matching depression. The first and second wafers are bonded together at least in part via magnetic attraction between respective magnetic layers in the projection and the depression.

7 Claims, 14 Drawing Sheets

U.S. PATENT DOCUMENTS

| | | |
|---|---|---|
| 7,217,592 B2 | 5/2007 | Nuggehalli et al. |
| 7,321,159 B2 | 1/2008 | Schatz |
| 2003/0098965 A1* | 5/2003 | Binnard et al. ................ 355/73 |
| 2007/0268475 A1* | 11/2007 | Binnard ....................... 355/72 |
| 2008/0067968 A1* | 3/2008 | Binnard et al. .............. 318/687 |
| 2008/0275661 A1* | 11/2008 | Yang et al. .................. 702/105 |
| 2008/0285004 A1* | 11/2008 | Binnard et al. ................ 355/72 |
| 2008/0285005 A1* | 11/2008 | Gery et al. .................... 355/72 |
| 2009/0001907 A1* | 1/2009 | Hosek et al. ................ 318/115 |
| 2009/0296069 A1* | 12/2009 | Shibazaki .................... 355/77 |

FOREIGN PATENT DOCUMENTS

| | | |
|---|---|---|
| WO | WO 2005/089184 A3 | 9/2005 |

\* cited by examiner

The donuts represent the electromagnets. Red and Cyan colors indicate magnets switched on to different polarities. Light blue indicate their off state. The polygons represent the devices which move along the arrows directed by the magents. The shaded polygonal regions are the recesses where the devices will be positioned.

METHOD OF ASSEMBLY USING ARRAY OF PROGRAMMABLE MAGNETS

CROSS-REFERENCE TO RELATED APPLICATIONS

The present application is related to and claims priority benefit to a co-pending, commonly assigned provisional patent application entitled "METHOD OF ASSEMBLY USING ARRAY OF PROGRAMMABLE MAGNETS," which was filed on Jun. 20, 2007 and assigned Ser. No. 60/936,421. The entire contents of the foregoing provisional patent application are incorporated herein by reference.

BACKGROUND

1. Technical Field

The present disclosure pertains to the manufacture of integrated electronic circuits, and more specifically relates to integration of microstructures and other structures onto a substrate.

2. Background Art

The incredible growth in wireless, Internet, opto-electronic communications, and biomedical application has created a need for low-cost, high-performance Microsystems, xyz on a chip, lab on a chip, etc., capable of receiving, processing, and transmitting large amounts of data quickly and precisely. However, the increasing use of millimeter-wave and optical channels for communications has made highly integrated, all-silicon communication chips impossible, because of silicon's ineffectiveness in optical and ultra-high speed applications. Instead, these functions are performed with one of three types of circuits: monolithic microwave integrated circuits (MMICs), opto-electronic integrated circuits (OEICs), or hybrid circuits. MMICs and OEICs can perform not only their optical or microwave functions, but also all of their data processing, using GaAs or InP substrates. This can result in inefficient utilization of the expensive III-V material. On the other hand, hybrid circuits include separate chips performing various functions of different materials, such as silicon chips for signal processing and III-V electronic devices to perform microwave or optical functions. The benefits of heterogeneous integration of high performance electrical, micro-electro-mechanical, and optoelectronic devices together onto the same substrate include lower parasitic losses, lower system weight, lower packaging costs, and increased reliability. Ultimately, such benefits have the potential to provide reduced cost, better performance microsystems.

Integrating different materials and different device functions has wide application in the market. But there are inherent problems in combining different materials. Such problems can include differences in thermal expansion coefficient between different materials. For example, the thermal expansion mismatch between silicon, the primary material of interest for large-scale high-density integrated circuits, and III-V compounds, the materials of interest for optoelectronic and microwave devices and circuits, is very large.

As the market for low cost and high performance electronic, optoelectronic, and electromechanical integrated circuits increases, many new assembly and integration techniques must be developed. For example, it has become increasingly important to integrate high performance low cost electronic, optoelectronic and/or radio frequency components onto dissimilar substrates. To improve system performance and reduce assembly cost, often compound semiconductor devices must be integrated monolithically to active circuitry contained in the substrate. Of primary interest among these is integrating such devices with silicon CMOS (Complementary Metal Oxide Semiconductor) technology, in order to increase the number of on-wafer functions available, and ultimately reduce the cost, size and weight of the micro-device based system.

Current integration strategies that rely on "pick and place" serial assembly techniques can encounter speed and cost constraints in applications that require the assembly of large numbers of microscale components with high positioning precision. In addition, surface forces must be carefully controlled to prevent unwanted adhesion of microscopic parts to each other, or to tool surfaces. Because of these disadvantages, new low-cost parallel assembly techniques are being investigated and commercialized.

As the dimensions of micro-electronic, micro-optoelectronic and micro-electromechanical devices and systems decrease, and as their complexity increases, there are good reasons to consider the use of self assembly and integration techniques to simplify the processing of these devices.

Some efficient approaches of heterogeneous integration include aligning separate discrete dice without individual manipulation of the devices. Such approaches include vector potential parts manipulation, DNA and electrophoresis-assisted assembly, and fluidic self-assembly techniques. These techniques each involve the assembling and integration of many individual units on processed integrated circuits (or other electronic substrates). The individual units (or microstructures) may be a single device, small assemblies of devices or fully integrated circuits.

The vector potential parts manipulation process allows for the alignment of separate devices in an assembly. This process most often uses electrostatics, to direct and place units. Units are placed on a vibrating stage and are attracted to potential wells on the substrate. As the vibration is reduced, the units position into place. At present, this method has been used to manipulate relatively large parts using high voltages in a specially prepared alignment fixture.

In the DNA and electrophoresis-assisted assembly technique, a DNA-like polymer film is formed on the individual parts and a complementary film is patterned on the wafer or on the circuit surface where the parts are to be placed. The attraction force between the two complementary DNA films then locates and holds the parts in position. An electrophoresis approach is also used to attract and place device parts on a surface electrode pattern.

Other approaches, such as the one described in U.S. Pat. No. 4,542,397, Biegelsen et al., involve methods for placing structures onto a substrate by mechanical vibration. Such methods may also employ pulsating air through apertures in the substrate.

In the fluidic self-assembly approach, carefully etched devices are placed in a substrate with etched recesses of matching dimensions. The host substrate is patterned with deep recesses that match the shape of the device. The specially shaped devices are separated from the growth substrate, suspended in a fluid, and flowed over the surface of the host substrate, and gravity is relied upon to get the devices into the recesses and to hold them there.

Despite efforts to date, a need remains for new systems and methods of assembling and integrating microstructures onto silicon wafers or other substrates that are cost-effective, compact, efficient, reliable, and/or require minimum maintenance; that can be carried out in such a manner to avoid damaging the preexisting electronics on the substrate; that take full advantage of very large diameter silicon wafers; and/or that facilitate transferring individual elements fabricated on an original substrate to pre-determined locations on a new substrate. These and other needs are satisfied by the systems and methods disclosed herein, as will be apparent from the description which follows.

SUMMARY

According to the present disclosure, advantageous systems and methods for assembling device structures on a substrate are provided. The disclosed systems and methods are particularly advantageous for the assembly of micro- and nano-scale device structures on a corresponding substrate.

Thus, in an exemplary embodiment of the present disclosure, an assembly system for assembling a structure onto a substrate is provided. The assembly system includes an array of magnets disposable beneath the substrate. The array of magnets is operable beneath the substrate for simultaneously levitating the structure above the substrate and moving the structure across the substrate. In some embodiments of the present disclosure, the assembly system includes a control system for controlling the magnets of the array for applying a magnetic field to the structure to translate and/or rotate the structure relative to the substrate in a plane containing the substrate. In some embodiments of the present disclosure, the assembly system includes a closed-loop control system which control system may include sensor apparatus including at least one of an optical imaging array, and Hall probe, a magneto-resistance probe, and a current sensor for measurement of eddy currents.

In an exemplary embodiment of the present disclosure, a method of assembly a structure onto a substrate is provided. The method includes providing an array of programmable magnets disposed beneath the substrate and applying to the structure a magnetic field adapted to levitate the structure above the substrate while the structure is being moved relative to the substrate for purposes of aligning the structure with a corresponding recess formed in the substrate. In some embodiments of the present disclosure, the method may include applying to the structure a magnetic field adapted to translate and/or rotate the substrate relative to the substrate in a plane containing the substrate.

Also according to the present disclosure, advantageous methods for bonding wafers are provided. Thus, in an exemplary embodiment of the present disclosure, a method of bonding wafers is disclose that includes forming a first wafer including a projection, the projection including a magnetic layer, forming a second wafer including a depression, the depression matching the projection and including a magnetic layer, magnetizing at least one of the magnetic layer of the projection and the magnetic layer of the depression, and mating the projection of the first wafer with the depression of the second wafer so as to bond the first and second wafers together at least in part via magnetic attraction between the respective magnetic layers. In some embodiments of the present disclosure, the method includes applying a binding adhesive to facing surfaces of the first and second wafers so as to bond the first and second wafers together at least in part via adhesion between the facing surfaces.

In an exemplary embodiment of the present disclosure, a bonded substrate assembly is provided that includes a first wafer including a projection, the projection including a magnetic layer, and a second wafer including a depression, the depression matching the projection and including a magnetic layer, wherein the projection of the first wafer is mated with the depression of the second layer such that the first and second wafers are bonded together at least in part via magnetic attraction between the respective magnetic layers. In some embodiments of the present disclosure, the bonded substrate assembly further includes a layer of bonding adhesive disposed between facing surfaces of the first and second wafers such that the first and second wafers are bonded together at least in part via adhesion between the facing surfaces.

Additional features, functions and benefits of the disclosed systems, apparatus and methods will be apparent from the detailed description which follows, particularly when read in conjunction with the appended figures.

BRIEF DESCRIPTION OF THE FIGURES

To assist those of ordinary skill in the art in making and using the disclosed systems and methods, reference is made to the accompanying figures, wherein.

DESCRIPTION OF EXEMPLARY EMBODIMENT(S)

In accordance with the present disclosure, methods and systems are provided for assembling one or more structures on a substrate utilizing an array of programmable magnets. The substrate can include a plurality of patterned recesses having transverse cross sections and openings of specific shapes and sizes. In some embodiments, a hard magnetic layer may be deposited at the bottom of each such recess. In other embodiments, no such hard magnetic layer is deposited at the respective bottoms of such recesses. The structures to be assembled, each of which can comprise a functional element, may have cross-sections matching the shapes and sizes of the recesses. In addition, each such structure may be coated at one end with a soft magnetic layer. A closed-loop computer may control the array of magnets to channel the structures across the substrate and place each such structure in an appropriate position within and among the recesses in the substrate in real time, and with precision. The structures may be held in place by strong short-range magnetic attractive force. A low-temperature alloy may be deposited at the bottom of each such recess, and low temperature fusion may be used to permanently bond the structures to the substrate.

Figure 1:
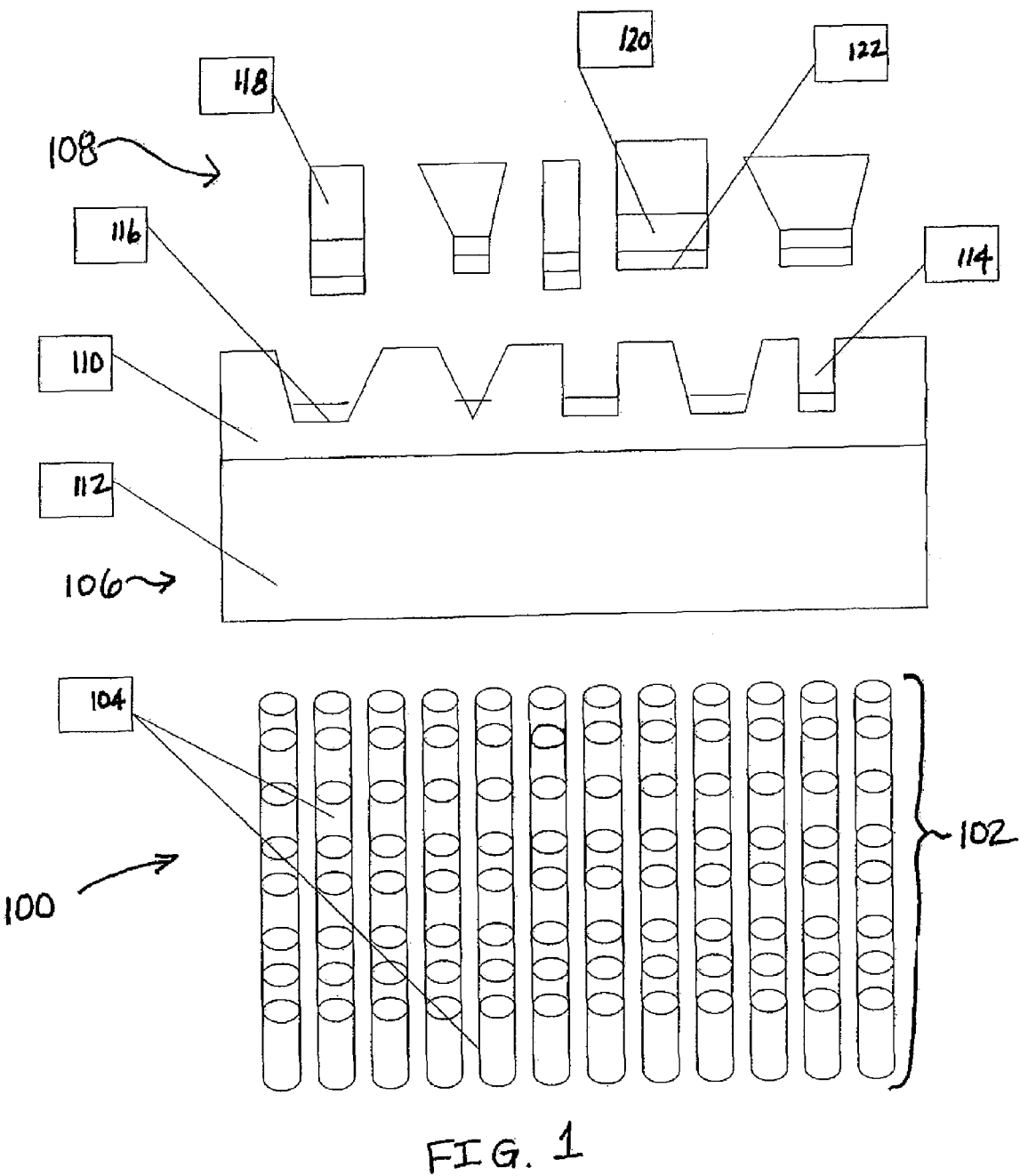
FIG. 1 is a schematic perspective side view of part of an assembly system for assembling structures onto a substrate according to the present disclosure.

Referring now to FIG. 1, an assembly system 100 including a magnet array 102 composed of magnets 104 is shown beneath a substrate 106. The magnet array 102 and the magnets 104 thereof are operable to move each device structure of a plurality of device structures 108 across and relative to the substrate 106 for purposes of assembling the device structures 108 therewith. The substrate 106 may include an insulating layer 110 and an epitaxial layer 112 disposed beneath the insulating layer 110. The epitaxial layer 112 or other layers of the substrate 106 may already have devices formed in it.

One or more recesses 114 may be formed in the insulating layer 110. As shown in FIG. 1, the insulating layer 110 may include a plurality of such recesses 114 formed in accordance with a predefined pattern. The substrate 106 may further include a hard magnetic layer 116 formed and magnetized at the bottom of each such recess 114. In some alternative embodiments of the substrate 106, no such hard magnetic layer 116 is formed at the bottoms of the recesses 114.

Each instance of the device structures 108 can include a device 118 disposed above a layer of substrate material 120 and, at a lower end of the substrate material 120, a layer of soft magnetic material 122. Each of the device structures 108 may be sized and shaped so as to fit within respective instance of a recess 114 formed in the insulating layer 110.

Figure 2:
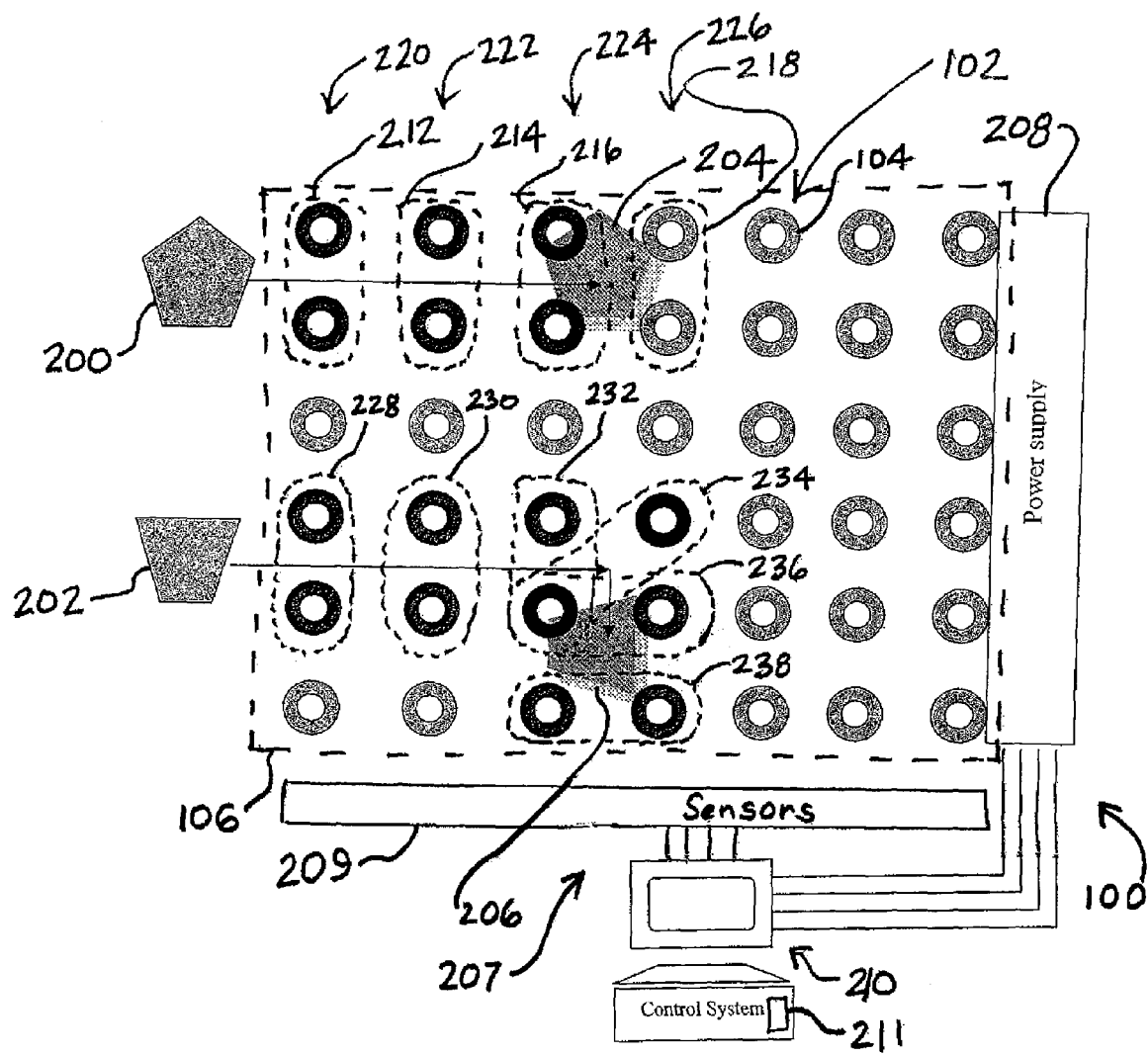
FIG. 2 is a schematic top view of the assembly system of FIG. 1, including a schematic illustration of a control system associated with the assembly system for controlling an array of programmable magnets in accordance with the present disclosure.

Referring now to FIG. 2, individual instances of the device structures 108 can be embodied by device structures of different shapes, such as a device structure 200, which as shown in FIG. 2 can have a pentagonal shape, and a device structure 202, which as shown in FIG. 2 can have another polygonal shape. The device structures 200, 202 are sized and shaped to be received in respective recesses 204, 206 formed in the insulating layer 108 (FIG. 1) of the substrate 106, the latter being shown in FIG. 2 otherwise only in outline form. Each of the recesses 204, 206 may be an example of a recess 112 (FIG. 1) discussed above with respect to the insulating layer 108 (FIG. 1) of the substrate 106.

The assembly system 100 may further include a control system 207 for utilizing the magnet array 102 to move the device structure 200, 202 relative to the substrate 106 and/or to deliver the device structures 200, 202 to and into the respective recesses 204, 206. The control system 207 may include a power supply 208, a sensor apparatus 209, and a controller 210. The sensor apparatus 209, while illustrated schematically in FIG. 2 as a rectangular block, may comprise a plurality of sensing elements (not shown) that track the assembly process and feed that information to the controller 210. The sensor apparatus 209 may function, for example, on one or more of the following principles, at least: optical imaging, fringing magnetic field, and/or eddy currents, to provide the controller 210 with real-time and/or on-demand information about the position, orientation, and movement of device structures such as the device structures 200, 202 relative to the substrate 106.

The power supply 208, the sensor apparatus 209, and the controller 210 of the control system 207 may, for example, form a closed loop, e.g., for manufacturing/process control purposes, and/or for purposes of developing a related manufacturing process. For example, the controller 210 may include an assembly agent 211, wherein the assembly agent 211 may take the form of a pre-determined, executable software routine (e.g., for directing a related process of efficiently and reliably manufacturing integrated circuits, and/or for determining the recipe parameters for such a manufacturing process) resident in a hardware, software, or firmware element (not separately shown) of the controller 210. In such circumstances, the sensor apparatus 209 may include one or more of the following (not otherwise shown): an optical imaging array for pattern recognition of the assembly process, Hall probes or magneto-resistance probes for magnetic field sensing (e.g., detection of associated fringing fields), and/or current sensors for measurement of eddy currents created by motion of objects/devices.

The controller 210 may be a computer or other processing device for operating the magnet array 102 of individual magnets 104 using the power supply 208, and/or based on information supplied to the controller 210 by the sensor apparatus 209, and/or via implementing the assembly program 211. Each of the individual magnets 104 may be an electromagnet susceptible to being energized by the controller 210 via the power supply 208. In turn, the controller 210 may be configured and interconnected with the power supply 208 in such a way as to permit the controller 210 to address the individual magnets 104 of the magnet array 102, e.g., individually, and/or in groups, such as row-by-row, or column-by-column, for purposes of energizing, de-energizing, and/or reversing the polarity of the magnets 104 as necessary or as per a predetermined recipe, for purposes of moving and/or reorienting the device structures 200, 202 relative to the substrate 106, as discussed in more detail below.

Under the control of the controller 210, the magnet array 102 may be utilized to move the device structures 200, 202 relative to the substrate 106 (e.g., laterally across (e.g., to and/or from anywhere in the x-y plane of) the substrate 106, and/or vertically (e.g., z-axis movement) relative to the substrate 106). For example, the controller 210 may function to selectively activate individual instances of the magnets 104, and/or selected, predetermined groups of the magnets 104, in such sequences and at such relative powers and/or relative polarities as to levitate the device structures 200, 202 relative to the substrate 106, and urge the device structures 200, 202 toward and into the respective recesses 204, 206. For instance, and as indicated in FIG. 2, the controller 210 may selectively activate magnets 104 in pairs 212, 214, 216, and 218 falling in respective columns 220, 222, 224, and 226 to create a moving wave or other magnetic field gradient to supply a levitating magnetic force to urge the device structure 200 from left to right across the substrate 106 in a controlled precise fashion to a vicinity of its respective recess 204, at which time the device structure 200 may be induced to settle into the recess 204, e.g., by further control of adjacent magnets 104 by the controller 210, and/or by virtue of the geometry of the recess 204 being such as to cause the levitating magnetic force to be reduced sufficiently to permit such insertion. The device structure 200 may be held in place, at least temporarily, within the recess 204 by strong short-range magnetic force. In the example of the device structure 202, for another instance, the controller 210 may selectively activate magnets 104 in pairs 228, 230, 232, 234, 236, and 238 to urge the device structure 202 from left to right across the substrate 106, as well as rotationally relative to the substrate 106, to deliver the structure 202 into the recess 206, wherein the device structure 202 may be held in place, at least temporarily, within the recess 206 by strong short-range magnetic force.

Figure 24:
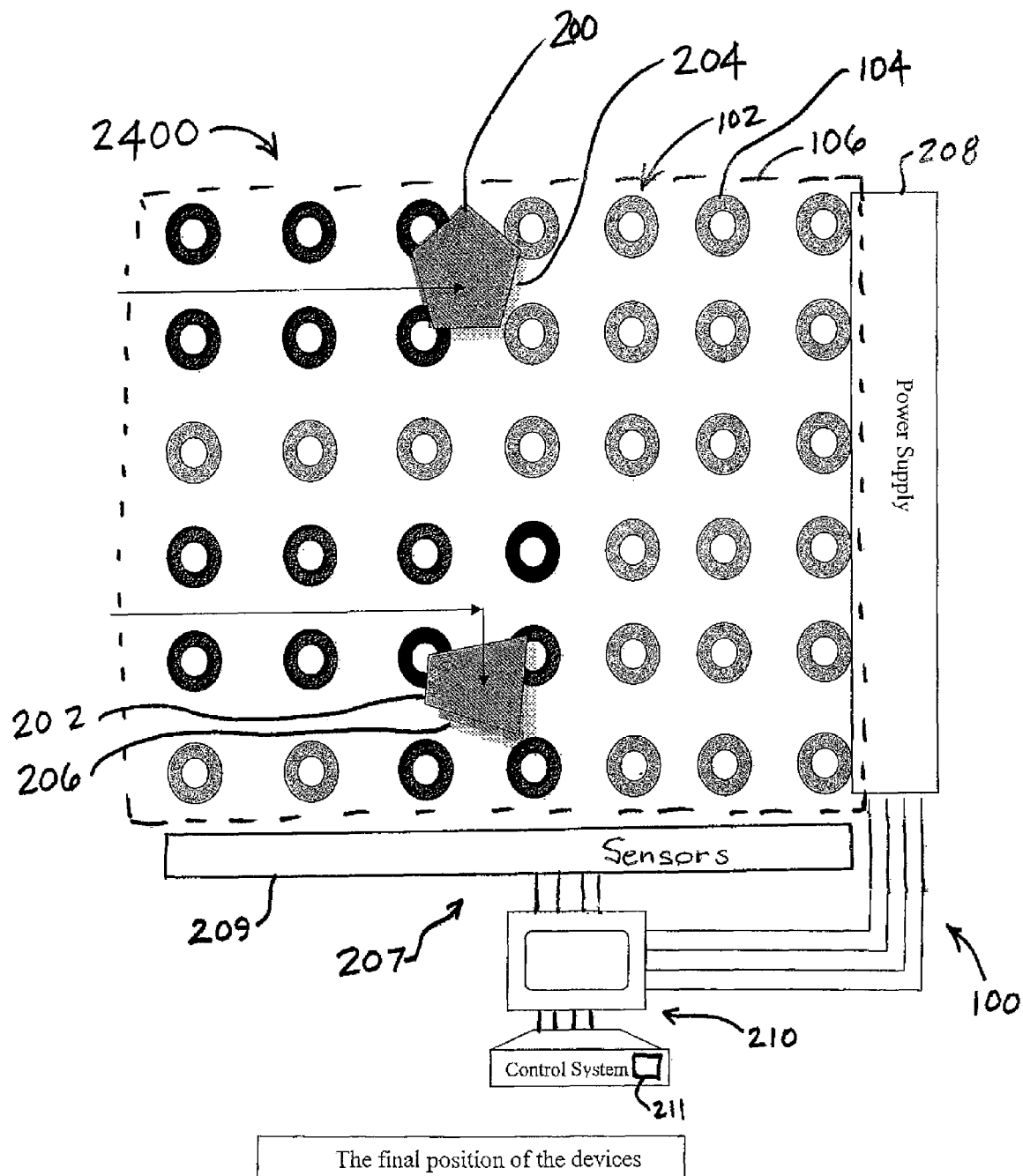
FIG. 24 is a schematic top view of the assembly system of FIG. 1, wherein the structures of FIG. 2 are shown in their final positions, populating respective recesses formed in the substrate in accordance with the present disclosure.

Final positions of the devices 200, 202 in the respective recesses 204, 206 are shown in FIG. 24, wherein upon so populating the recesses 204, 206 with the respective devices 200, 202, a substrate assembly 2400 is produced including the substrate 106 and the devices 200, 202. Further assembly and/or manufacturing steps may be taken upon so populating the recesses 204, 206, e.g., depending upon the particular manufacturing recipe being used or implemented, and/or the particular integrated circuit being fabricated. For example, a low temperature alloy may be deposited at the bottom of each of the recesses 204, 206, and the permanent bonding of the devices 200, 202 within the recesses 204, 206 may be achieved by using low temperature fusion.

A focusing method may be used with respect to the magnet array 102 of magnets 104 connected to the power supply 208. For example, in some embodiments, the magnets 104 may take the form (e.g., as shown in FIG. 2) of annular rings or donuts. In such circumstances, a modified version (not separately shown) of the magnet array 102 in accordance with embodiments of the present disclosure may include soft magnetic cores (not shown), wherein the magnets 104 may take the form of excitation coils surrounding such soft magnetic cores. The magnetic cores may be used to conduct the corresponding magnetic flux lines away from the vicinity of the coils to precisely located pole tips (not separately shown) positioned near the substrate 106 and/or remotely with respect to the magnetic coils. Remotely positioning such pole tips relative to the excitation coils may allow reducing the size of the related poles (not shown) and/or the spacing between individual instances of such poles, which is useful for articulating magnetic control on a length scale that may be considerably finer than the sizes of the coils themselves. The magnetic cores may, for example, be comprised of a soft magnetic material (e.g., for low coercive force) such as pure iron and/or iron crystal whiskers. In some embodiments, such focusing of the magnetic flux lines may be accomplished by tapering the cores from a relatively larger cross-sectional area at the excitation coils to a relatively smaller cross-sectional area at the pole tips. In some embodiments, the core can be a tapered piece of polycrystalline iron onto which an iron whisker pole tip is attached. An array of magnetic pole tips prepared in this manner may function equivalently to the magnet array 102 shown in FIG. 2.

Figure 3:
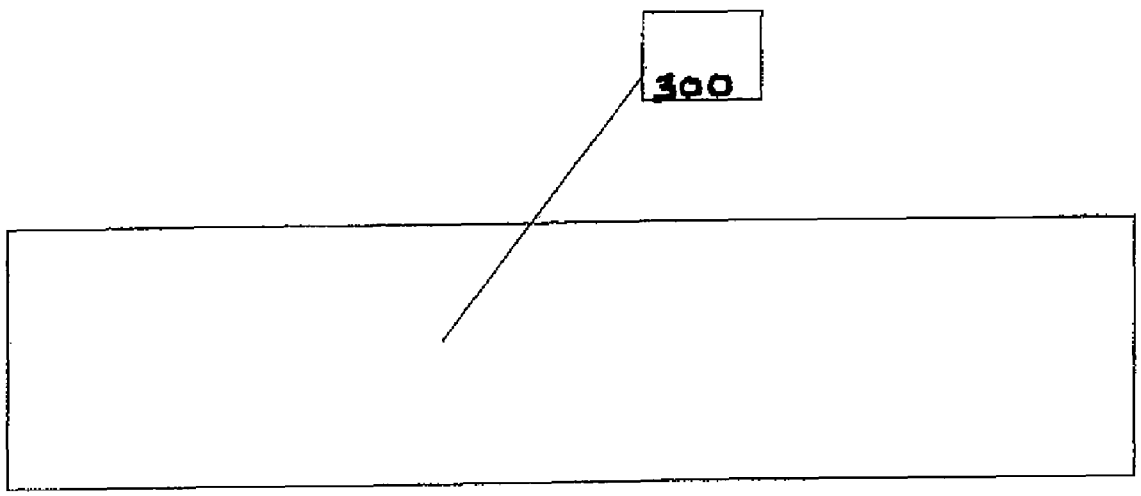
FIGS. 3, 4, 5 and 6 schematically illustrate a sequence of steps that may be used to fabricate a substrate in accordance with the present disclosure.
Figure 4:
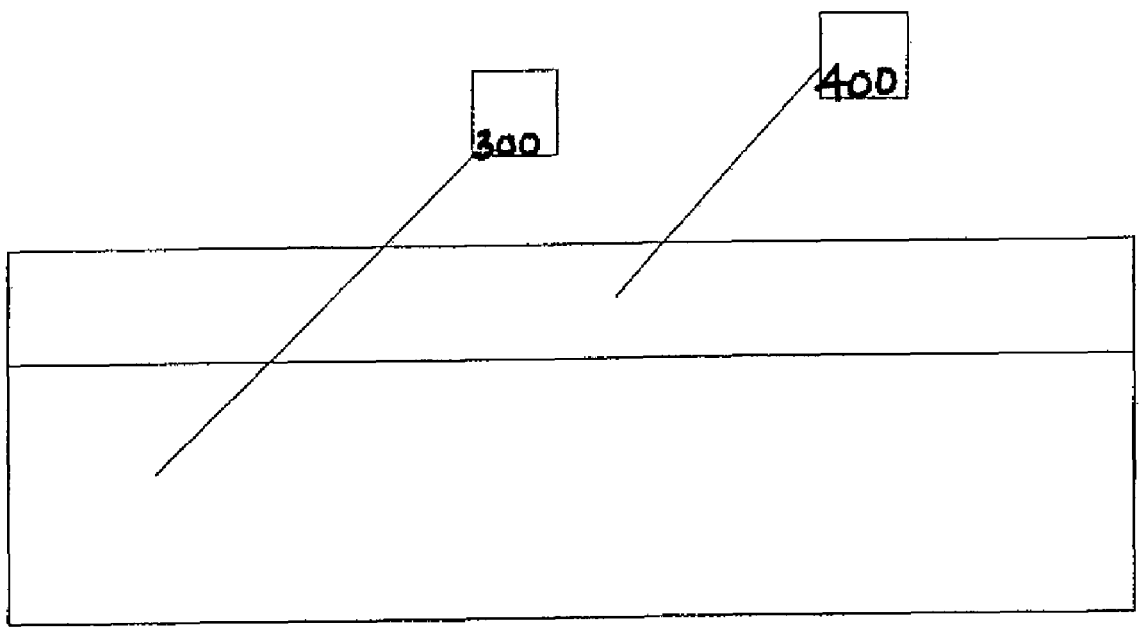
Figure 5:
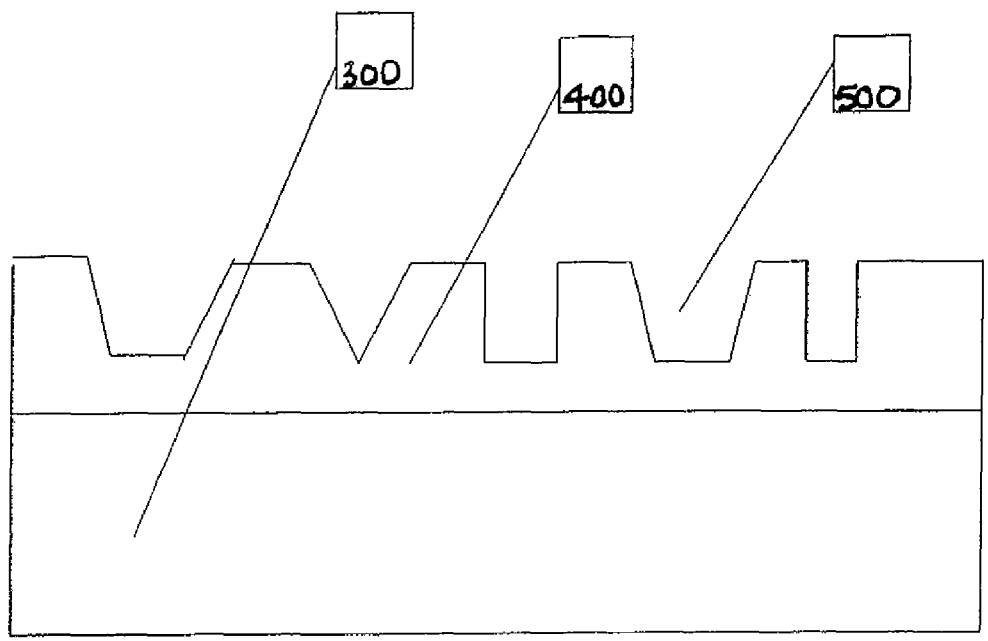
Figure 6:
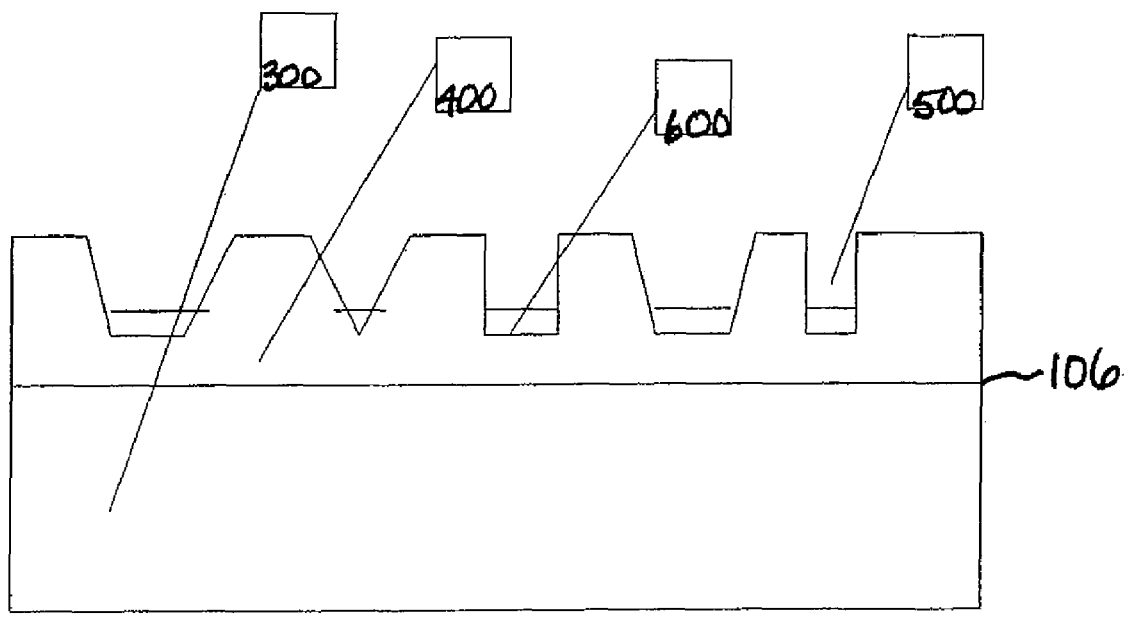

Referring now to FIGS. 3-6, a sequence of views are shown with respect to an exemplary process of fabricating the substrate 106 (FIG. 1) in accordance with the present disclosure. In FIG. 3, an epitaxial layer 300 is shown. The epitaxial layer 300 may be a Si wafer or other substrate (including a flexible substrate). In FIG. 4, the epitaxial layer 300 is provided with an insulating layer 400 of insulating material. In FIG. 5, patterned recesses 500 are formed in the insulating layer 400. As shown in FIG. 6, a magnetized hard magnetic layer 600 is formed at the bottom of each of the patterned recesses 500, thereby forming the substrate 106.

Figure 7:
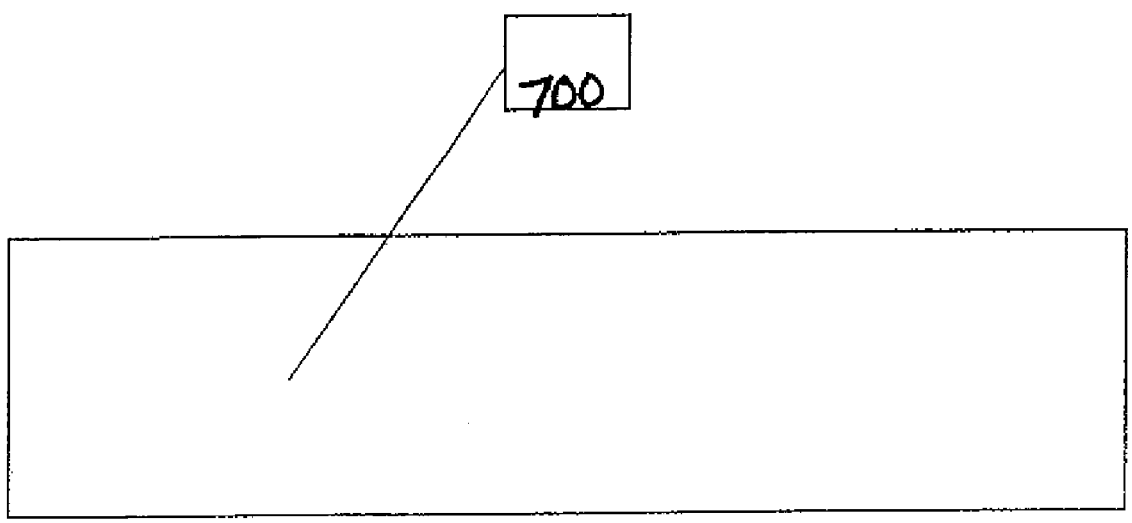
FIGS. 7, 8, 9 and 10 schematically illustrate a sequence of steps that may be used to fabricate a device structure in accordance with the present disclosure.
Figure 8:
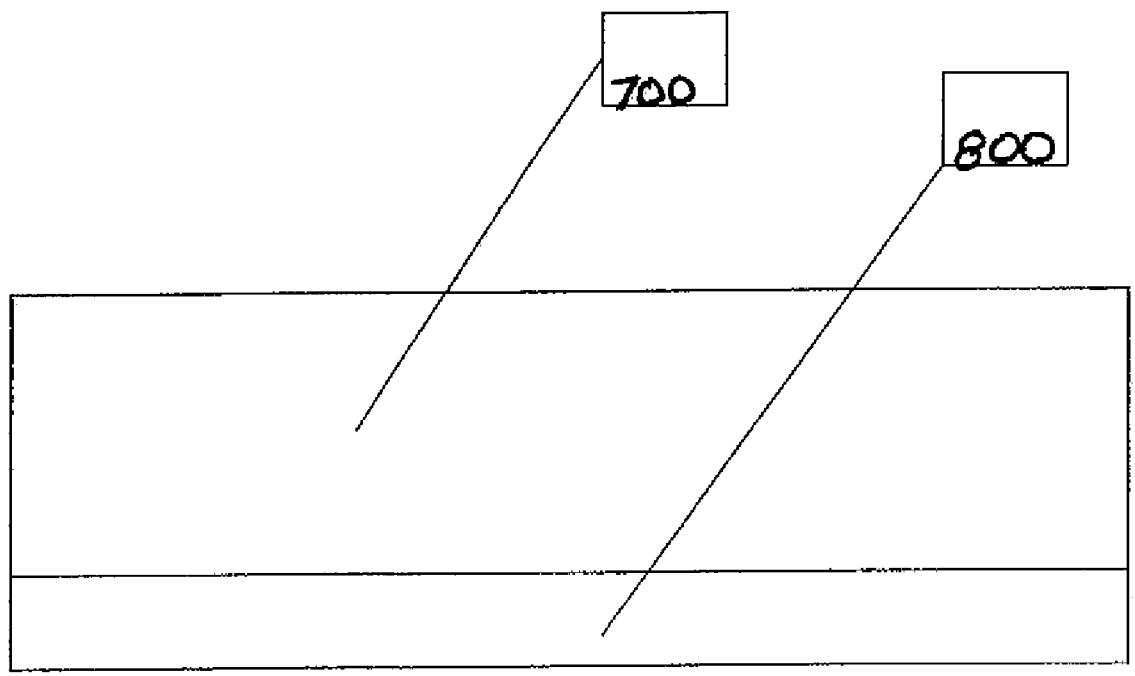
Figure 9:
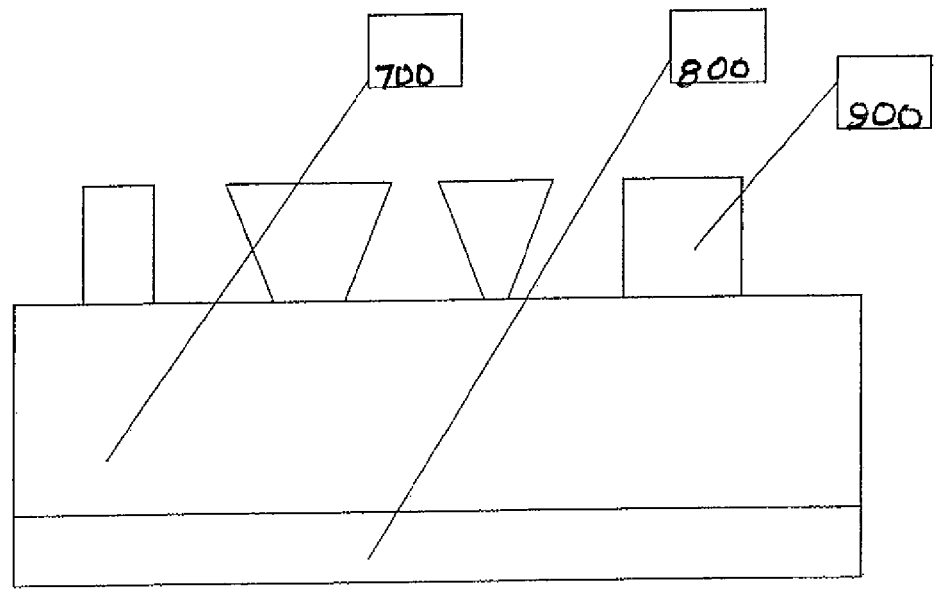
Figure 10:
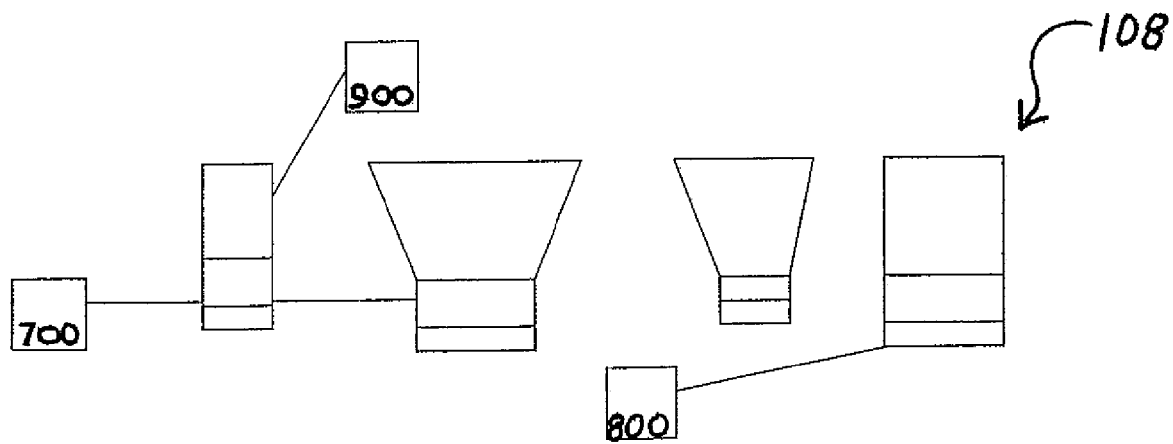

Referring now to FIGS. 7-10, a sequence of views are shown with respect to an exemplary process of fabricating the device structures 108 in accordance with the present disclosure. In FIG. 7, a layer 700 of optoelectronic substrate material is shown. In FIG. 8, a soft magnetic layer 800 is formed at a lower end of the substrate layer 700. In FIG. 9, optoelectronic devices 900 are formed atop the substrate layer 700. As shown in FIG. 10, unused portions of the substrate layer 700 and the magnetic layer 800 are removed (e.g., via an appropriate etching process, sawing, etc.) to form the device structures 108.

Description of Respective Modified Versions of Substrate 106, Device Structure 108, and Substrate Assembly 2400, Additional Background Information Related Thereto I. Additional Background Information It is well known in the microelectronics arts to use wafer bonding to bond one wafer to another wafer in order to efficiently manufacture complementary metal-oxide semiconductor (CMOS) circuitry, monolithic integration of silicon integrated electronic circuits and III-V semiconductor electronic and optical devices, and/or to fabricate micromachined structures such as Microelectromechanical Systems (MEMS) for sensors, solar cells, actuators, biological and biomedical devices, and also for a wide range of other applications.

There are many reasons to integrate electronics in a thin film of silicon on top of an insulating substrate. Among these are enhanced speed, increased radiation hardness, higher levels of integration, and backside illumination useful for optical detectors. Silicon On Insulator (SOI) materials have been obtained through a variety of methods. In a SOI wafer, two different processes are widely used in general. One of them is the BE (Bond and Etch) method, which is to bond two wafers and etch back one of them in order to make a thin layer. The other is called SIMOX (Separation By Implantation of Oxygen) method, which is to implant oxygen deep into the silicon wafer and form a buried oxide and a thin silicon layer by post-implantation heat treatment.

For example, monolithic integration of III-V laser diodes and p-i-n detectors with high density, high performance silicon complementary metal oxide semiconductor (CMOS) circuitry is desired to produce robust optoelectronic integrated circuits. Semiconductors, such as silicon, germanium, or gallium arsenide, are commonly utilized to build components such as Microelectromechanical Systems (MEMS), that provide various functions in numerous devices. For example, MEMS may be used in pressure sensors, inkjet printers, accelerometers, crash sensors in vehicles, inertial instruments, gyros, etc. A growing segment of the semiconductor business consists of high voltage/high power devices and integrated circuits. An important element in this industry is the power MOSFET. Power MOSFETs have many diverse applications in communications, automotive, data processing, consumer, industrial and military markets. Power MOSFETs built in SiC have the potential for significantly (as much as two orders of magnitude) higher performance compared to silicon wafers.

Within the semiconductor industry, there are numerous applications that require bonding two or more semiconductor wafers, each having a similar crystal lattice or crystal lattice that is different from the other. Silicon wafer bonding, which is bonding a silicon wafer to another silicon wafer, is a useful replacement for conventional epitaxial processing. Unprocessed or partially processed silicon top wafers can be bonded to an insulating bottom wafer or substrate to form a silicon on insulator (SOI) structure. Some recent applications take advantage of flexibility of wafer bonding to create devices in which both the top and bottom wafers are processed to provide devices with complex buried layer structures.

It may be desirable to bond a non-silicon substrate to a silicon substrate. Although silicon-to-silicon wafer bonding is well known, the bonding of a non-silicon substrate to a silicon substrate is not as straightforward as silicon-to-silicon bonding.

Semiconductor materials with different properties often have different lattice constants. Therefore, deposition of one semiconductor material on top of another substrate material can result in defects in the semiconductor layer, potentially rendering it useless for practical applications. Another method of integrating materials is through the use of wafer bonding. The bonding process removes the lattice mismatch problem; however there may be a problem with mismatch in thermal expansion. Due to such a mismatch in thermal expansion coefficients in the bonded materials, the materials may not be able to be subsequently processed or annealed at optimum temperatures without also causing material degradation.

Two different ways of bonding semiconductor wafers are predominantly utilized, such as anodic bonding and fusion bonding.

In conventional anodic bonding processes, a silicon wafer and a sodium-containing glass substrate having similar coefficients of thermal expansion are joined together. Wafer bonding is typically carried out at a temperature between 200° C. and 500° C., while a voltage of 500 to 1500 V DC is typically applied across the substrates. The glass substrate is held at a negative potential, inducing positive sodium ions to be mobile in the heated glass and to migrate away from the silicon-glass interface toward the cathode leaving behind negative fixed charges. Bonding of the substrate may be complete when the ion current vanishes, indicating that a layer depleted of mobile sodium ions has been produced, and that non-bridging oxygen atoms have attached to silicon atoms to form silicon dioxide bonds.

Because the respective coefficients of thermal expansion as between glass and silicon in anodic bonding are typically not identical, thermal stresses may be induced in the manufacture of a MEMS device such that the device may exhibit impaired performance over temperature. To the extent pyrex glass is used as the substrate material, many processes may be prohibited, such as anisotropic etching, and electrochemical etching steps, as compared to the use of silicon. On the other hand, the use of borosilicate glass may present the problem of high processing temperatures, as well as the tendency of the borosilicate glass surface to precipitate boric acid, potentially rendering the joining of wafers impossible.

Fusion bonding processes are generally performed by hydrolyzing the surfaces of the wafers, aligning the wafers relative to each other as needed, and contacting the wafers together. The wafers are then typically exposed to a fusion bonding temperature between 300° C. and 800° C., and subsequently annealing is typically carried out at a relatively high temperature, such as 800° C. to 1100° C., in order to increase the bond strength.

Depending on cleanliness and contact conditions, the fusion bonding process may cause trapped contaminants and gas pockets that result in poorly bonded wafers. Although fusion bonding is often utilized to manufacture silicon MEMS, such devices may exhibit inconsistent bond strengths across the wafer due to discontinuous bond areas caused by etching of the desired devices. While such a process permits the joining of wafers already possessing microelectronics surface structures, the use of high processing temperatures and special preparation of wafer surfaces may introduce subsequent manufacturing difficulties, potentially including imposing a maximum temperature, such as 420° C., below which the processed standard silicon substrate can not be further processed.

Figure 11:
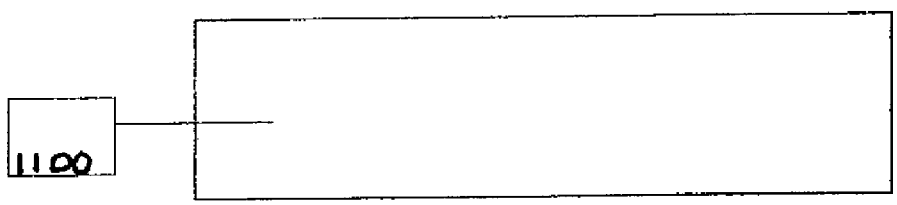
FIGS. 11, 12, 13, 14 and 15 schematically illustrate a sequence of steps that may be used to fabricate a substrate in accordance with the present disclosure.
Figure 12:
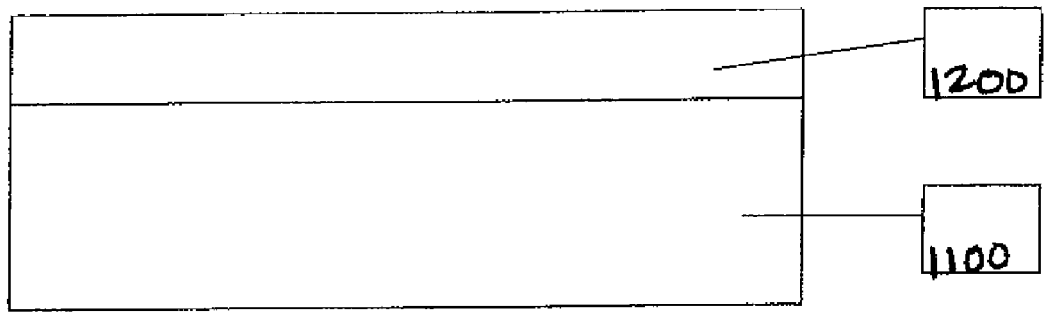
Figure 13:
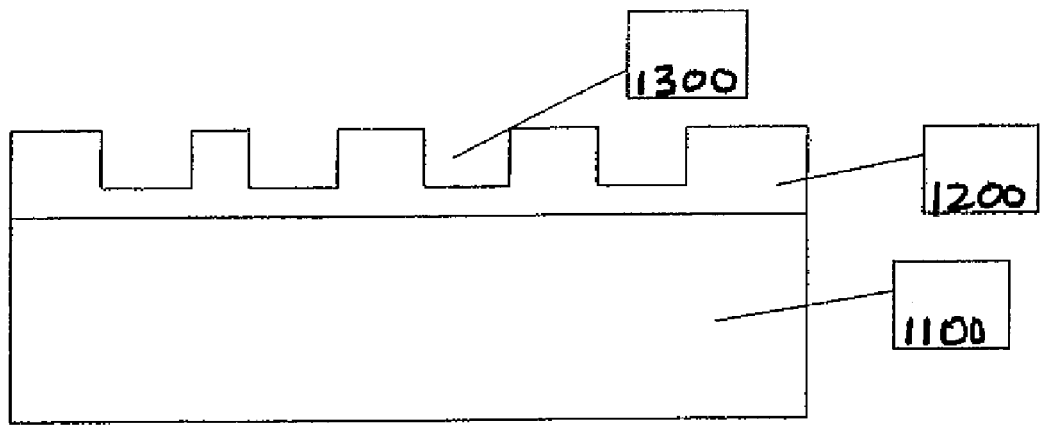
Figure 14:
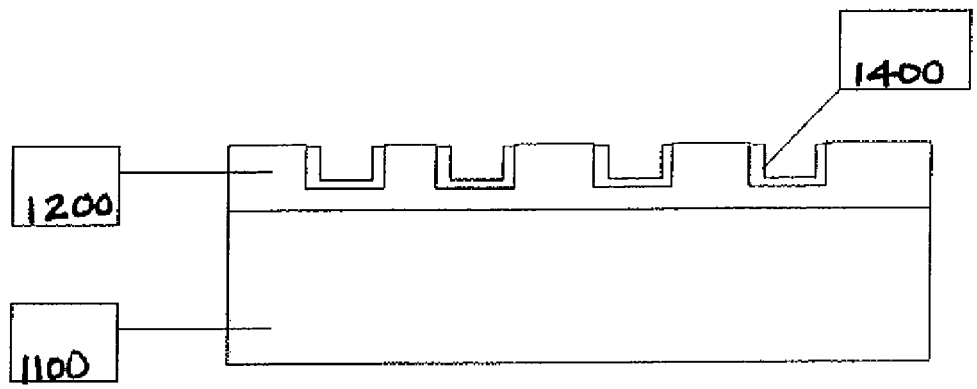
Figure 15:
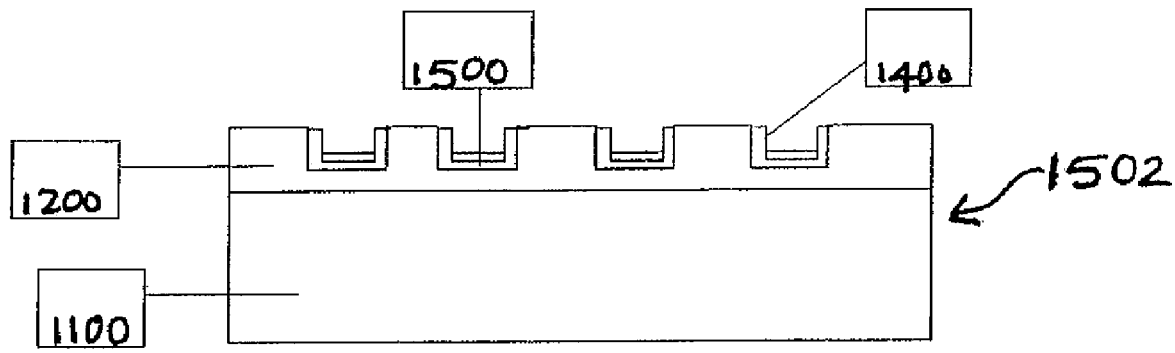

II. Description of Respective Modified Versions of the Substrate 106, the Device Structure 108, and the Substrate Assembly 2400, in Accordance with the Present Disclosure Referring now to FIGS. 11-15, a sequence of views are shown with respect to an exemplary process of fabricating a modified version of the substrate 106 (FIG. 1) in accordance with the present disclosure. In FIG. 11, an epitaxial layer 1100 is formed, which may comprise Al2O3 or silicon or GaAs or the like, and have a desired thickness. In FIG. 12, the epitaxial layer 1100 is provided with an insulating layer 1200 of insulating material, such as SiO2 (e.g., via oxidation), and/or Al2O3, Ta2O5, or TiO2 via an atomic layer epitaxial (ALE) method such as ALCVD, ASCVD, ALD, etc. In FIG. 13, patterned trenches 1300 may be formed in the insulating layer 200, e.g., via patterning and/or etching, etc. As shown in FIG. 14, a layer 1400 of a polymeric material is formed within each of the trenches 1300 via deposition, patterning, and/or etching. In FIG. 15, a hard magnetic layer 1500 is formed at the bottom of each of the patterned recesses 1300 and magnetized, thereby forming a substrate assembly 1502, wherein the substrate assembly 1502 may be a modified version of the substrate 106 (FIG. 1).

Figure 22:
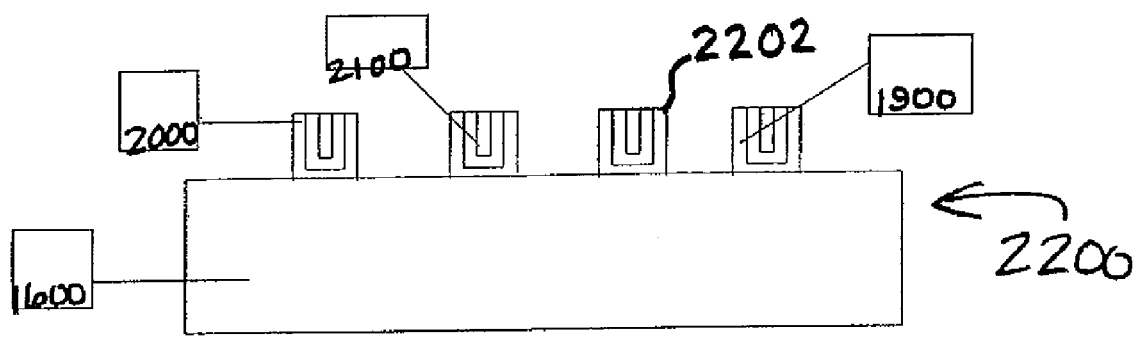
FIGS. 16, 17, 18, 19, 20, 21 and 22 schematically illustrate a sequence of steps that may be used to fabricate a device structure in accordance with the present disclosure.
Figure 16:
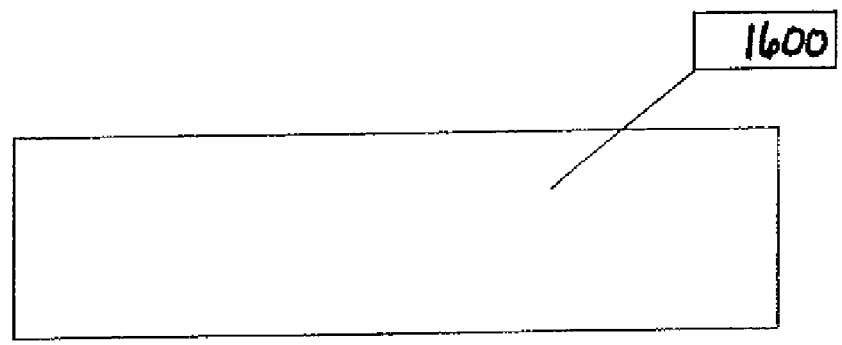
Figure 17:
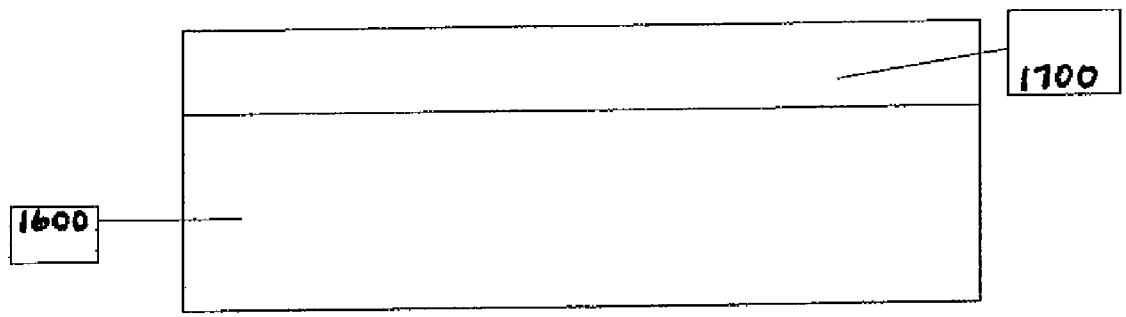
Figure 18:
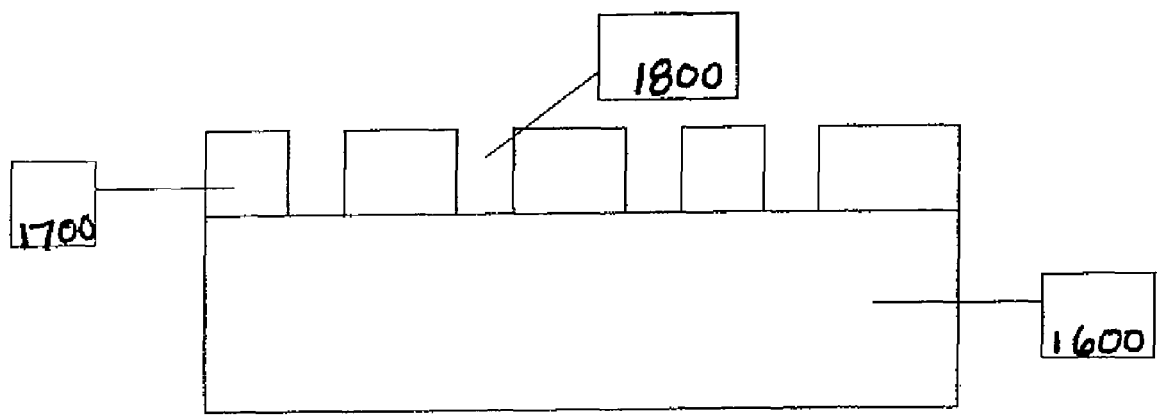
Figure 19:
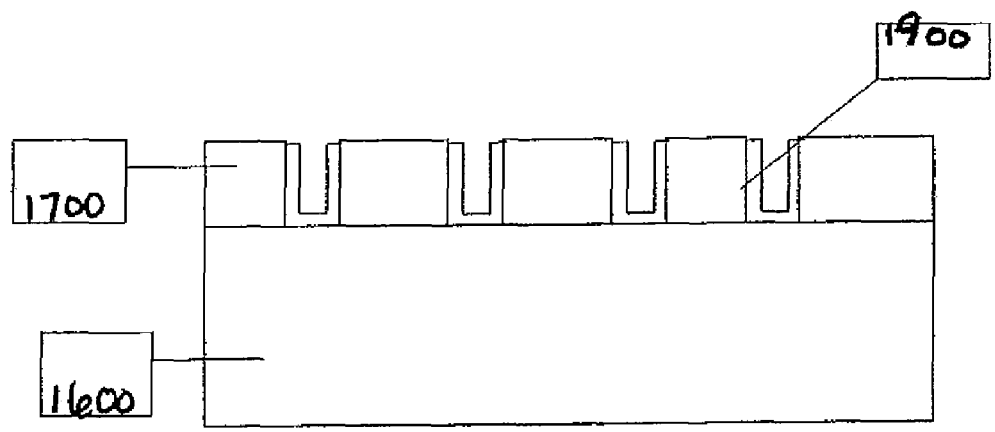
Figure 20:
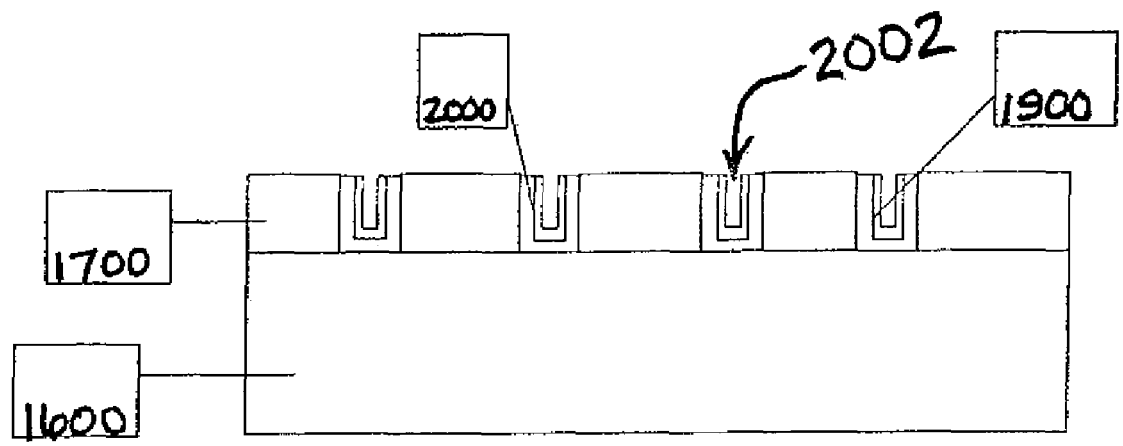
Figure 21:
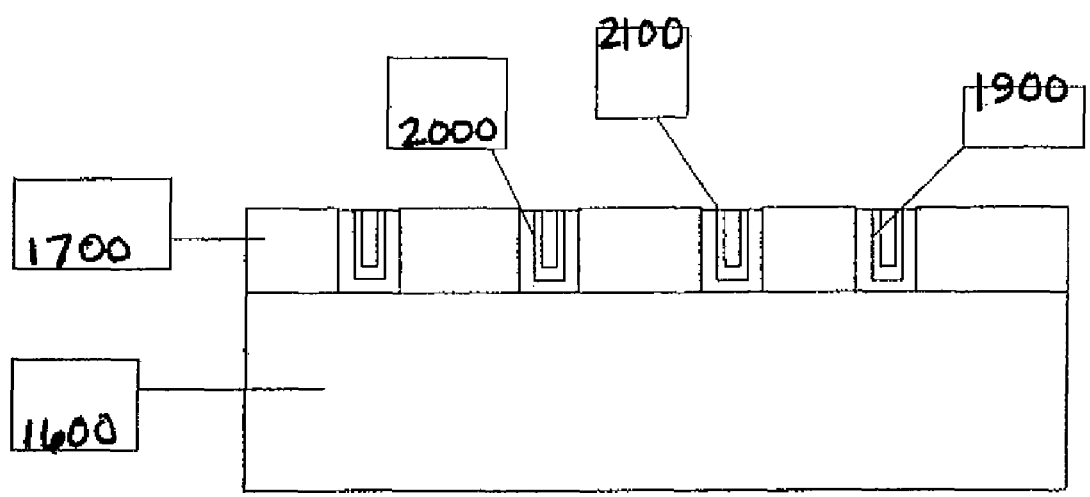

Referring now to FIGS. 16-22, a sequence of views are shown with respect to an exemplary process of fabricating a modified version of the device structures 108 in accordance with the present disclosure. In FIG. 16, an epitaxial layer 1600 is formed, which may comprise Al2O3, or silicon or GaAs or the like and having a desired thickness. In FIG. 17, the epitaxial layer 1600 is provided with an insulating layer 1700 of an insulating material, such as SiO2 (e.g., via oxidation), and/or Al2O3, Ta2O5, or TiO2 via an atomic layer epitaxial (ALE) method such as ALCVD, ASCVD, ALD, etc. In FIG. 18, patterned trenches 1800 are formed in the insulating layer 1700, e.g., via patterning and/or etching, etc. As shown in FIG. 19, a layer 1900 of SiO2 or Si3N4 is formed within each of the trenches 1800. In FIG. 20, a layer 2000 of a polymeric material is formed on the layer 1900 within each of the trenches 1800, wherein the layer 2000 may itself form a trench 2002. In FIG. 21, a soft magnetic layer 2100 is formed in the trench 2002 formed by the layer 2000 within each of the trenches 1800. In FIG. 22, part of all of the insulating layer 1700 is removed to form a device structure 2200 including extended projections or ridges 2202 of magnetic material in respective polymer trenches on a silicon wafer (or another material). The device structure 2200 may be a modified version of the device structure 108 (FIG. 1).

Figure 23:
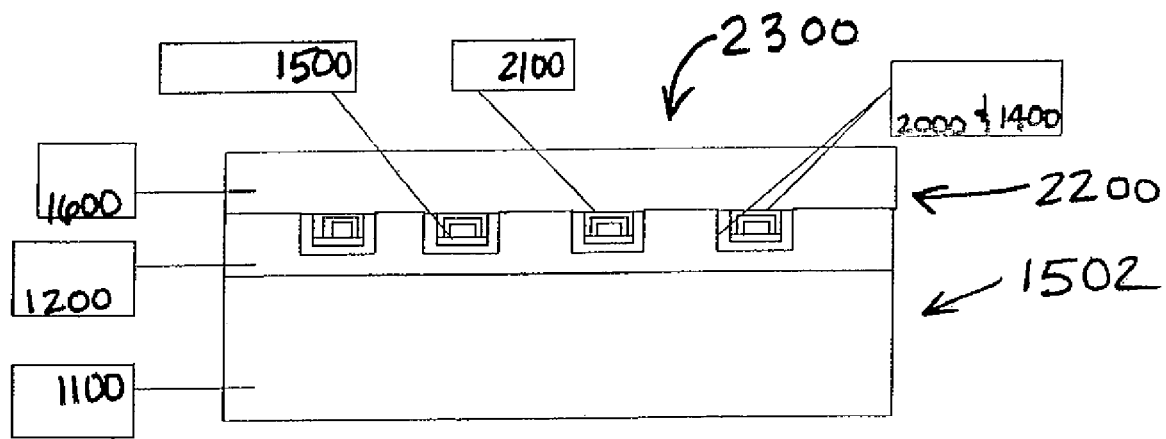
FIG. 23 schematically illustrates a bonded assembly in accordance with the present disclosure.

Turning now to FIG. 23, the device structure 2200 mates with the substrate 1502 to form a bonded assembly 2300. Such mating may include applying a binding polymer (not separately shown) to facing surfaces of one or both of the device structure 2200 and the substrate 1502 prior to mating of same. Otherwise, such mating may be executed via a process similar to the above-described process (see FIGS. 2 and 24) for mating the device structure 108 to the substrate 106. For example, in accordance with the present disclosure, wafers may be bonded using a magnetic field assisted wafer bonding technique, and/or the use of an adhesive polymer.

A similar process to that described herein with reference to FIGS. 11-23 may be performed with respect to an SOI or Silicon on Insulator wafer. More particularly, essentially the same process may be carried out, with the possible exception that both wafers are silicon wafers, the respective insulating layers are silicon dioxide (SiO2), and the resulting bonded wafer assembly is thinned down. Cutting of this bonded wafer assembly may be performed by a smart cut process. Finally, a CMP process may be applied in order to obtain a smoother surface and/or the desired thickness.

The bonding processes of FIGS. 11-23 have advantages over known wafer bonding processes. First, for temperature sensitive components such as MEMS structures or for CMOS circuitry, the high temperature required by many known wafer bonding process can tend to damage the MEMS structures or the CMOS circuitry. In embodiments of the present disclosure, no such high-temperature bonding need necessarily take place with respect to the bonded assembly 2300. Second, whereas in some instances it may be desirable to bond several substrates onto a single substrate, many known wafer bonding processes may not amendable to such applications. By contrast, in at least some embodiments of the present disclosure, the bonded assembly 2300 may include multiple substrates such as the substrate 2200 bonded to a single substrate such as the substrate 1502. Third, whereas many known wafer bonding processes use high pressure to bring corresponding wafers into contact with each other, such high pressure bonding can result in distortion, stress, damage or breakage to the wafers or to the resulting wafer bond. In embodiments of the present disclosure, no such high pressure bonding need necessarily take place with respect to the bonded assembly 2300.

Although the systems, apparatus and methods of the present disclosure have been described with reference to exemplary embodiments and implementations, the present disclosure is not limited to or by such exemplary embodiments and/or implementations. Rather, the disclosed systems, apparatus and methods are susceptible to various changes, variations, modifications and/or enhancements without departing from the spirit or scope hereof. Accordingly, the present disclosure expressly encompasses all such changes, variations, modifications and/or enhancements within its scope.

For example, in at least some embodiments of the present disclosure, one or more magnets 104 of the magnet array 102 may be moveable, e.g., at least laterally in the x-y plane of the substrate 106, as needed or as desired. Such an arrangement may facilitate prompt and efficient delivery of the device structures to corresponding recesses formed in the substrate 106. In some such embodiments, the control system 207 may include motors and/or actuators and/or other associated structure (not shown) to carry out such movement of the magnets 104, and the controller 210 may be operable to control a corresponding operation of such motors and/or actuators, e.g., in accordance with a predetermined manufacturing recipe.

For another example, in at least some embodiments of the present disclosure, either or both of the substrates 106 or 1502 includes one or more recesses for receiving corresponding device structures in which no hard magnetic layer is deposited within such recess or recesses, such that no reliance need necessarily be made on short range magnetic attractive force to hold such device structures in place.

For still another example, in at least some embodiments of the present disclosure, the structures and device fabrication methods described above with respect to FIGS. 11-23 can be applied to provide an improved method of bonding a III-V semiconductor material to a silicon wafer so that subsequent processing of devices on these materials can successfully take place, as well as an improved method of bonding different materials having similar or different crystal lattices and/or coefficients of thermal expansion (CTE), in addition to providing an improved method of forming Silicon On Insulator (SOI) substrates.

The invention claimed is:

1. An assembly system for assembling a structure onto a substrate, comprising:

a structure;
a substrate movably positioned relative to the structure; and
an array of magnets disposed beneath the substrate and operable thereat for simultaneously levitating the structure above the substrate and moving the structure across the substrate.

2. The assembly system of claim 1, further comprising a control system for controlling the magnets of the array for applying a magnetic field to the structure to translate the structure relative to the substrate in a plane containing the substrate.

3. The assembly system of claim 1, further comprising a control system for controlling the magnets of the array for applying a magnetic field to the structure to rotate the structure relative to the substrate in a plane containing the substrate.

4. The assembly system of claim 1, further comprising a control system for controlling the magnets of the array for moving the structure relative to the substrate in a plane containing the substrate by inducing at least temporary differences between or among the programmable magnets of the array with respect to at least one parameter selected from a group comprising: relative magnetic polarity, energized status versus de-energized status, and relative strength of magnetic field.

5. The assembly system of claim 1, further comprising a closed-loop control system for controlling a movement of the structure relative to the substrate in a plane containing the substrate.

6. The assembly system of claim 1, further comprising a control system for controlling a movement of the structure relative to the substrate in a plane containing the substrate, the control system including a sensor apparatus including at least one selected from a group comprising: an optical imaging array for pattern recognition of the assembly process, a Hall probe, a magneto-resistance probe, and a current sensor for measurement of eddy currents.

7. The assembly system of claim 1, further comprising a computerized control system, the computerized control system including a computer containing a computer-readable medium, on which computer-readable medium is recorded a computer-executable code for enabling the computer to execute a predetermined manufacturing recipe for employing the array of magnets to move the structure across the substrate to a corresponding recess formed therein, and to rotate the structure as necessary to rotationally align the structure relative to the corresponding recess.

* * * * *